United States Patent [19]

Eisele et al.

[11] Patent Number: 6,117,622
[45] Date of Patent: *Sep. 12, 2000

[54] CONTROLLED SHRINKAGE OF PHOTORESIST

[75] Inventors: Jeffrey Allan Eisele, Germantown; Robert Douglas Mohondro, Sykesville, both of Md.

[73] Assignee: Fusion Systems Corporation, Rockville, Md.

[*] Notice: This patent issued on a continued prosecution application filed under 37 CFR 1.53(d), and is subject to the twenty year patent term provisions of 35 U.S.C. 154(a)(2).

[21] Appl. No.: 08/924,096

[22] Filed: Sep. 5, 1997

[51] Int. Cl.⁷ ........................................................ G03F 7/40
[52] U.S. Cl. ........................... 430/328; 430/322; 430/330
[58] Field of Search ..................... 430/311, 322, 430/328, 330, 331, 394

[56] References Cited

U.S. PATENT DOCUMENTS

| | | | |
|---|---|---|---|
| 4,842,992 | 6/1989 | Arai | 430/328 |
| 4,921,778 | 5/1990 | Thackeray et al. | 430/326 |
| 5,096,802 | 3/1992 | Hu | 430/328 |
| 5,108,875 | 4/1992 | Thackeray et al. | 430/326 |
| 5,272,042 | 12/1993 | Allen et al. | |
| 5,344,742 | 9/1994 | Sinta et al. | 430/270 |
| 5,350,660 | 9/1994 | Urano et al. | 430/176 |
| 5,366,851 | 11/1994 | Novembre | 430/322 |
| 5,385,809 | 1/1995 | Bohrer et al. | 430/311 |
| 5,516,608 | 5/1996 | Hobbs et al. | 430/30 |
| 5,556,734 | 9/1996 | Yamachika et al. | 430/270.1 |
| 5,558,978 | 9/1996 | Schädeli et al. | 430/270.1 |
| 5,585,507 | 12/1996 | Nakano et al. | 556/7 |

FOREIGN PATENT DOCUMENTS 2001384  4/1990  Canada .

OTHER PUBLICATIONS

Mixon, D.A., et al., "Effect of Partial Deprotection on Lithographic Properties of t–Butoxycarbonyloxystyrene––Containing Polymers," *SPIE*, vol. 2195, pp. 297–306.

Hiroshi Ito, "Deep–UV Resists: Evolution and Status", *Solid State Technology*, Jul. 1996, pp. 164–173.

Nalamasu, Omkaram, et al., "Recent Progress in Resist Materials for 193 NM Lithography", *Future Fab International*, pp. 159–163.

Conley, Will, et al., "Performance of an Advanced DUV Photoresist for 256Mb DRAM Fabrication", *Future Fab International*, pp. 123–130.

*Primary Examiner*—Kathleen Duda
*Attorney, Agent, or Firm*—Pollock, Vande Sande & Amernick

[57] ABSTRACT

A process for controlled shrinkage of photolithographic features formed in photoresist. A shrinkage profile is determined for the photoresist and sizes of the photolithographic features. The photoresist is then exposed to ultraviolet radiation and elevated temperature until the photolithographic features shrink a desired amount.

23 Claims, 10 Drawing Sheets

CONTROLLED SHRINKAGE OF PHOTORESIST

FIELD OF THE INVENTION

The invention is related to a process for controlling feature shrinkage of a chemically amplified Deep UV photoresist.

BACKGROUND OF THE INVENTION

Microelectronic devices in integrated circuits are manufactured by means of photolithographic techniques. Fabricating various structures, particularly electronic device structures, typically involves depositing at least one layer of a photosensitive material, typically known as a photoresist material, on a substrate. The photoresist material may then be patterned by exposing it to radiation of a certain wavelength to alter characteristics of the photoresist material. Typically, the radiation is from the ultraviolet range of wavelengths. The radiation causes desired photochemical reactions to occur within the photoresist.

The photochemical reactions alter the solubility characteristics of the photoresist, thereby allowing removal of certain portions of the photoresist. Selectively removing certain parts of the photoresist allows for the protection of certain areas of the substrate while exposing other areas. The remaining portions of the photoresist typically are utilized as a masks or stencils for processing the underlying portions of the substrate.

An example of such a process is in the fabrication of semiconductor devices wherein, for example, layers are formed on a semiconductor substrate. Certain portions of the layers may be removed to form openings through the layers. The openings may allow diffusion of desired impurities through the openings into the semiconductor substrate. Other processes are known for forming devices on a substrate.

Devices such as those described above, may be formed by introducing of a suitable impurity into a layer of a semiconductor to form suitably doped regions therein. In order to provide distinct P or N regions, which are necessary for the proper operation of the device, introduction of impurities should occur through only a limited portion of the substrate. Usually, this is accomplished by masking the substrate with a resist material and subsequently etching a diffusion resistant material, such as silicon dioxide or silicon nitride to a desired depth to form a protective mask to prevent diffusion through selected areas of the substrate.

The mask in such a procedure is typically provided by forming a layer of material over the semiconductor substrate and, afterward creating a series of openings through the layer to allow the introduction of the impurities directly into the underlying surface. These openings in the mask are readily created by coating the silicon wafer with a material known as a photoresist. Photoresists can be negative photoresist or positive photoresist materials.

A negative photoresist material is one which is capable of polymerizing and being rendered insoluble upon exposure to radiation, such as UV radiation. Accordingly, when employing a negative photoresist material, the photoresist is selectively exposed to radiation, causing polymerization to occur above those regions of the substrate which are intended to be protected during a subsequent operation. The unexposed portions of the photoresist are removed by a solvent which is relatively unaffected to the polymerized portion of the photoresist.

Positive photoresist material is a material that, upon exposure to radiation, is capable of being rendered soluble in a solution, such as an aqueous alkaline solution in which the unexposed resist is not soluble. Accordingly, when applying a positive photoresist material the photoresist is selectively exposed to radiation, causing the reaction to occur above those portions of the substrate which are not intended to be protected during the subsequent processing period. The exposed portions of the photoresist are removed by an aqueous alkaline solution which has a minimal impact on the unexposed portion of the resist.

Photoresist materials may similarly be used to define other regions of electronic devices.

In an effort to increase the capability of electronic devices, the number of circuit features included on, for example, a semiconductor chip, has greatly increased. When using a process such as that described above for forming devices on, for instance, a semiconductor substrate, increasing the capability and, therefore, the number of devices on a substrate requires reducing the size of the devices or circuit features.

One way in which the size of the circuit features created on the substrate has been reduced is to employ mask or reticle structures having smaller openings. Such smaller openings expose smaller portions of the semiconductor wafer surface, thereby creating smaller structures in the photoresist. In order to produce smaller structures in the photoresist, shorter wavelength ultraviolet radiation is also used in conjunction with the mask or reticle to image the photoresist.

After forming features in the photoresist, electronic device features may be formed in or on the substrate upon which the photoresist is deposited. However, prior to forming the devices, the photoresist may be subjected to a photostabilization process.

Photostabilization typically is a post-lithography process that can maintain resist feature sidewall profiles, minimize outgassing, minimize blistering, minimize resist popping and reduce resist residue and particles. Photostabilization makes photolithographic features more rigid and more robust so as to make them more resistant to subsequent processing. Photostabilization can also reduce process delays. Photostabilization is described in U.S. Pat. No. 4,548,688 issued Oct. 22, 1985, to Matthews for Hardening of Photoresist and Apparatus, the entire disclosure of which is hereby incorporated by reference.

Photostabilization utilizes electromagnetic energy, (photons), typically in the Deep UV range and heat to cure or densify a photoresist. Preferably, the heat is applied by ramping up the temperature. Typically, the photoresist is subjected to UV radiation while simultaneously being heated. The radiation and heat initiates chemical cross-linking reactions within the resist.

Some researches have found that photostabilization of features defined with a Deep UV or chemically amplified resists causes a shrinkage in features formed in the Deep UV photoresist. Such shrinkage is considered to be very detrimental to the subsequent formation of electronic device structures in and on the semiconductor wafer upon which photoresist is deposited. The shrinkage will occur along the length, width and height of the resist features. In other words, film thickness and critical dimension will both be affected by the photostabilization process.

Horizontal shrinkage (along the length or width) can result in significant undesirable change between the feature imaged in the photoresist and the subsequently etched feature. Vertical (height) shrinkage may result in a diminished amount of resist, which may result in inadequate protection of the underlying substrate, particularly during anisotropic etching. Many researchers have avoided the use of Deep UV resist photostabilization processes so as to attempt to minimize the shrinkage that is known to occur during the processing of Deep UV resists.

Typically, the substrate and photoresist are subjected to processes such as etch and implant directly after the formation of features in the photoresist, such as by photolithography. This is done even though it is known that a certain amount of shrinkage occurs during processes such as etch and implant. The shrinkage is simply calculated into the size of the features created in the photoresist. However, there are inherent uncertainties in the shrinkage that occurs during, for example, etching. Typically, shrinkage occurring during etching is not reproducible, is variable, and changes with the load on the etcher.

SUMMARY OF THE INVENTION

The present invention addresses the above and other problems, presenting a solution that takes advantage of the phenomenon of shrinkage.

It is an object of the present invention to provide a method for controlling feature shrinkage occurring during photostabilization of photoresist.

According to preferred aspects, the present invention provides a process for controlled shrinkage of photolithographic features formed in a Deep UV or chemically amplified photoresist during photostabilization. The method includes determining a shrinkage profile for the photoresist. The Deep UV photoresist is then exposed to ultraviolet radiation and elevated temperatures until the photolithographic features shrink to a desired amount.

According to other preferred aspects, the present invention provides a method for forming a semiconductor device. The method includes photolithographically forming features in a photoresist on a surface of a semiconductor wafer. The semiconductor wafer and the photoresist are subjected to a post exposure bake process. The semiconductor wafer and the photoresist are subjected to a developing process. The semiconductor wafer and the photoresist are subjected to a photostabilization process. The photostabilization process results in shrinkage of the photolithographic features. The semiconductor wafer and the photoresist are processed to form circuit features in and/or on the semiconductor wafer.

Still other objects and advantages of the present invention will become readily apparent to those skilled in the art from the following description. The detailed description shows and describes only preferred embodiments of the invention so as to illustrate the best mode contemplated for carrying out the invention. As those skilled in the art will realize, the invention includes other and different embodiments. Details of the invention may be modified in various respects, without departing from the invention. Accordingly, the drawings and description should be regarded as illustrative in nature and not restrictive.

DETAILED DESCRIPTION OF THE INVENTION

Figure 1:
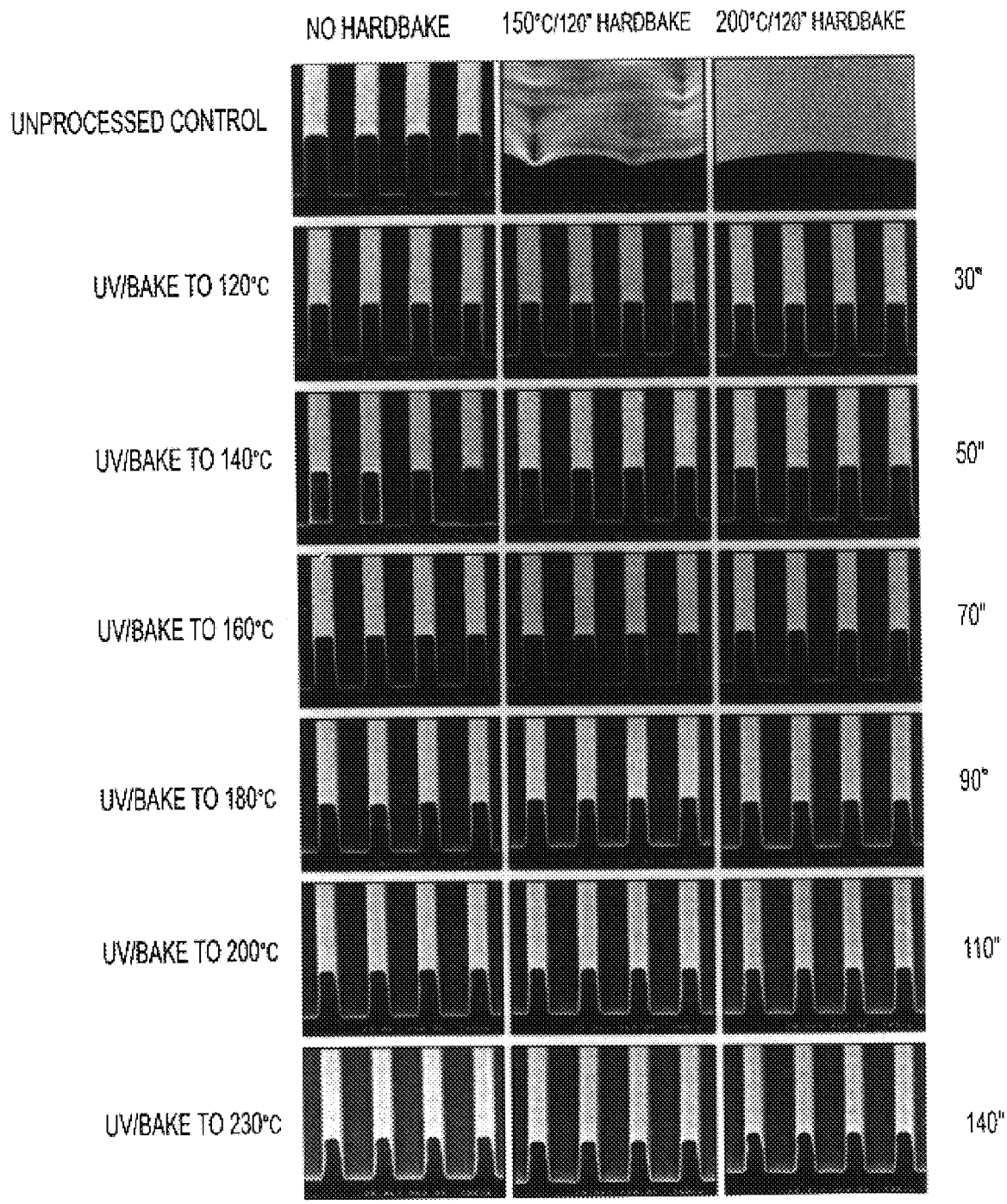
FIG. 1 includes a series of photomicrographs representing a series of features realized in a Deep UV resist and subjected to a variety of photostabilization and bake processes to show the various stages of acquired, controlled shrinkage.

As discussed above, the phenomenon of shrinkage of features formed in Deep UV photoresist is known. Typically, avoiding any shrinkage of features formed in photoresist is a very important consideration in post formation processes. In fact, as discussed above, photostabilization processes are generally avoided with certain Deep UV resist processes due to the known shrinkage that occurs as a result of the processes.

The inventors of the present invention have unexpectedly discovered that the shrinkage occurring during photostabilization can be controlled and advantageously utilized in processes for forming semiconductor devices. By taking advantage of the shrinkage that occurs, the present invention may permit the next smaller generation of device sizes to be achieved without requiring the development of the next generation of exposure tools and photoresists. The generations of device sizes are loosely defined at 0.25 $\mu$m, 0.18 $\mu$m, and 0.12 n.

Even though the present invention utilizes a photostabilization process, the process is terminated at a point where some shrinkage has occurred but is less than or equal to a shrinkage deemed acceptable in the application. The present invention also produces a known amount of shrinkage that may be included in design processes.

The inventors of the present invention have discovered that permitting the photostabilization process to proceed beyond typical known shrinkage points, the shrinkage eventually becomes uniform and slow. Although shrinkage occurs and, in some instances, a great deal of shrinkage occurs, the inventors of the present invention have discovered that this shrinkage may be advantageously utilized in the semiconductor device production process. Unlike shrinkage that occurs, for example, when treating a photoresist in a plasma, the shrinkage that occurs according to the present invention is controllable and predictable.

In order to accommodate for shrinkage, resist thicknesses can be increased to compensate for vertical shrinkage. By increasing thicknesses, an ample amount of resist will remain after photostabilization for protecting a substrate or other functions.

However, resist thicknesses may not need to be increased. This would be due to the increased hardening of the Deep UV resist as a result of the Deep UV resist being subjected to the photostabilization process. The photostabilization process may sufficiently cross-link and thereby harden the Deep UV photoresist to the point where the increase in etch selectively compensates for the decreased film thickness.

By utilizing the present invention, smaller device sizes can be created and device density can be increased without the need for developing new exposure tools capable of creating the smaller device sizes without taking into account shrinkage. Accordingly, smaller device sizes can be achieved on a chip with much lower cost since photostabilization can be carried out with a relatively low cost, existing apparatus. On the other hand, an exposure tool capable of creating smaller device sizes does not yet exist and would cost much more.

Utilizing the present invention, features initially formed in the photoresist typically have dimensions from about 0.25 $\mu$m to about 0.18 $\mu$m. Utilizing the process of the present invention, features starting out at such sizes may be shrunk from about 5% to about 30%. Preferably, the process of the present invention results in shrinkage of features of such sizes of from about 20% to about 30%. The present invention may result in shrinkage of features having such dimensions of from about 0.25 $\mu$m to about 0.18 $\mu$m.

Of course, the amount of shrinkage according to the present invention may vary, depending upon the process parameters utilized. The process parameters will be discussed below in greater detail.

Since the shrinkage has been found, according to the present invention, to be predictable and controllable, by taking into account the amount of shrinkage, the amount of shrinkage can be taken into account when forming features in photoresist that is then subjected to processes according to the present invention. In addition, the amount of shrinkage, when determined to be exact to a known degree or percentage of shrinkage, can be taken into account when the process is designed. Subsequently, masks or reticles can be manufactured based on the known amount of shrinkage. The manipulation of the mask data in regards to the known amount of shrinkage is known as mask biasing.

According to one embodiment of a process according to the present invention, photoresist, in which features have been photolithographically formed, is exposed to ultraviolet radiation and elevated temperatures until the features shrink a desired amount.

Prior to carrying out the exposure, the shrinkage profile of the photoresist involved may be determined. The shrinkage profile may include the amount of shrinkage experienced in photolithographic features formed in the photoresist when exposing the features to a variety of photostabilization, hard bake, and/or other processes. Examples of such experiments are shown in the Figures. The Figures show at least a portion of the shrinkage profile for the photoresist. The shrinkage profile may depend upon the dimensions of the photolithographic features. Once aware of the present disclosure, one skilled in the art could determine the shrinkage profile of a photoresist without undue experimentation.

According to the process, the ultraviolet radiation may have a wavelength of from about 250 nm to about 350 nm. However, any wavelength may be utilized to produce a desired shrinkage and/or degree of photostabilization.

The elevated temperature that the photoresist is exposed to may be from about 20° C. to about 230° C. Preferably, the temperature is from about 120° C. to about 230° C. More preferably, the temperature is from about 160° C. to about 230° C. Additionally, the temperature may be at least about 160° C.

The temperature may vary, depending upon the photoresist being utilized. Factors that may effect the temperature include the glass transition temperature of the photoresist, the solvent content of the photoresist, and/or the percentage of solids in the photoresist.

The photoresist may be expose to the full elevated temperature immediately. Alternatively, the temperature may start out at a low point and be increased, or ramped up, to a high temperature. The temperature may be ramped up slowly or quickly. During the ramping up process, the temperature may level off, or plateau, for a period of time. After plateauing, the temperature may again be increased. The temperature may be plateaued and ramped multiple times before reaching a final temperature.

After reaching a final high temperature, the temperature may be decreased. According to some embodiments, the photoresist is removed from the apparatus at the final temperature and, thereby immediately exposed to ambient temperatures. Alternatively, the temperature may be ramped downwardly. When being ramped down, the temperature may again be plateaued one or more times.

Parameters such as the radiation and its characteristics, the elevated temperature, and exposure times may vary depending upon the amount of shrinkage desired. They may also differ depending upon the photoresist used.

The period of time the photoresist and substrate are exposed to the elevated temperature and the radiation may depend upon the amount of shrinkage desired as well as the photoresist being utilized. According to one embodiment, the substrate and photoresist are exposed to elevated temperature and radiation for a time from about 20 seconds to about 220 seconds. Preferably, the substrate and photoresist are exposed to elevated temperature and radiation for a time from about 30 seconds to about 220 seconds. More preferably, the substrate and photoresist are exposed to elevated temperature and radiation for a time from about 30 seconds to about 140 seconds. Most preferably, the substrate and photoresist are exposed to elevated temperature and radiation for a time from about 70 seconds to about 140 seconds. Alternatively, the substrate and photoresist are exposed to elevated temperature and radiation for a time at least about 70 seconds.

As can be seen, the present invention carries out the photostabilization process for a longer time than is know in the art. According to the art, photostabilization time is shorter, in particular, to avoid shrinkage. The present invention continues the photostabilization process beyond the point where it would normally be stopped.

Of particular importance seems to be the uniformity of the light and heat that the photoresist is exposed to. Unlike shrinkage that may normally occur in an etcher, the present invention applies a more uniform process, particularly after repeated uses. On the other hand, while an etcher may produce some shrinkage in photoresist, the shrinkage is unpredictable, and not uniform. The non-uniformity of the shrinkage experienced when utilizing an etcher is compounded by materials that may build up in the etcher, altering the process conditions as the etcher is used more. Additionally, the present invention is not for exposing already exposed features to do something to the features, as an etch.

According to preferred embodiments, the ultraviolet radiation utilized in processes according to the present invention is deep ultraviolet radiation. In other words, the radiation, is from deep within the ultraviolet band. That is, ultraviolet radiation tending to have smaller wavelengths.

The present invention also includes methods for forming semiconductor devices. Such methods include photolithographically forming features in photoresist deposited on the surface of a semiconductor wafer. The photoresists are exposed to wavelengths of radiation sufficient to alter the solubility characteristics of the photoresist. The semiconductor wafer and the photoresist are subjected to a post exposure bake process. The semiconductor wafer and photoresist are then subjected to a developing process.

Next, the semiconductor wafer and photoresist are subjected to a photostabilization process. The photostabilization process results in shrinkage of the photolithographic features. The semiconductor wafer and photoresist are then processed to form circuit features in and/or on the semiconductor wafer.

Methods of photolithographically forming features in photoresists, methods of exposing photoresist, post exposure bake processes, developing processes, and methods for forming circuit features in and/or on semiconductor wafers are known. For examples of such processes, please see P. van Zant, *Microchip Fabrication*, McGraw-Hill, 1997, or L. Thompson, G. Willson, M. Bowden, *Introduction to Microlithography*, 2nd Edition, American Chemical Society, 1994, the entire contents of both of which are hereby incorporated by reference.

The photostabilization process referred to above includes subjecting the photoresist and the semiconductor wafer to ultraviolet radiation and elevated temperature. The same parameters discussed above for the radiation and the temperature apply to processes of the present invention for forming semiconductor devices.

The present invention can also be considered to include semiconductor devices formed utilizing processes according to the present invention. Furthermore, the present invention includes a photostabilized photoresist including photolithographically formed features that have been shrunk according to processes of the present invention.

FIG. 1 includes a series of photomicrographs showing the various stages of acquired, controlled shrinkage of grouped lines of photoresist having a width of about 0.25 ∞m after exposure to a variety of photostabilization and bake processes, the parameters of which are noted at the heads of the columns and rows. As stated above, the examples shown in FIGS. 1 and 2 and the results shown in the graphs of FIGS. 3–10 were carried out utilizing Shipley UV4 Deep UV resist (PHS/ESCAP) available from Shipley, Incorporated. The first column of FIG. 1 shows a series of photomicrographs wherein moving down the column, the amount of time that the features have been exposed to photostabilization increases from about 0 seconds to about 140 seconds in the bottom photo of the first column. The second and third columns show the results of carrying out a subsequent hardbake on the features processed in the first column.

Figure 2:
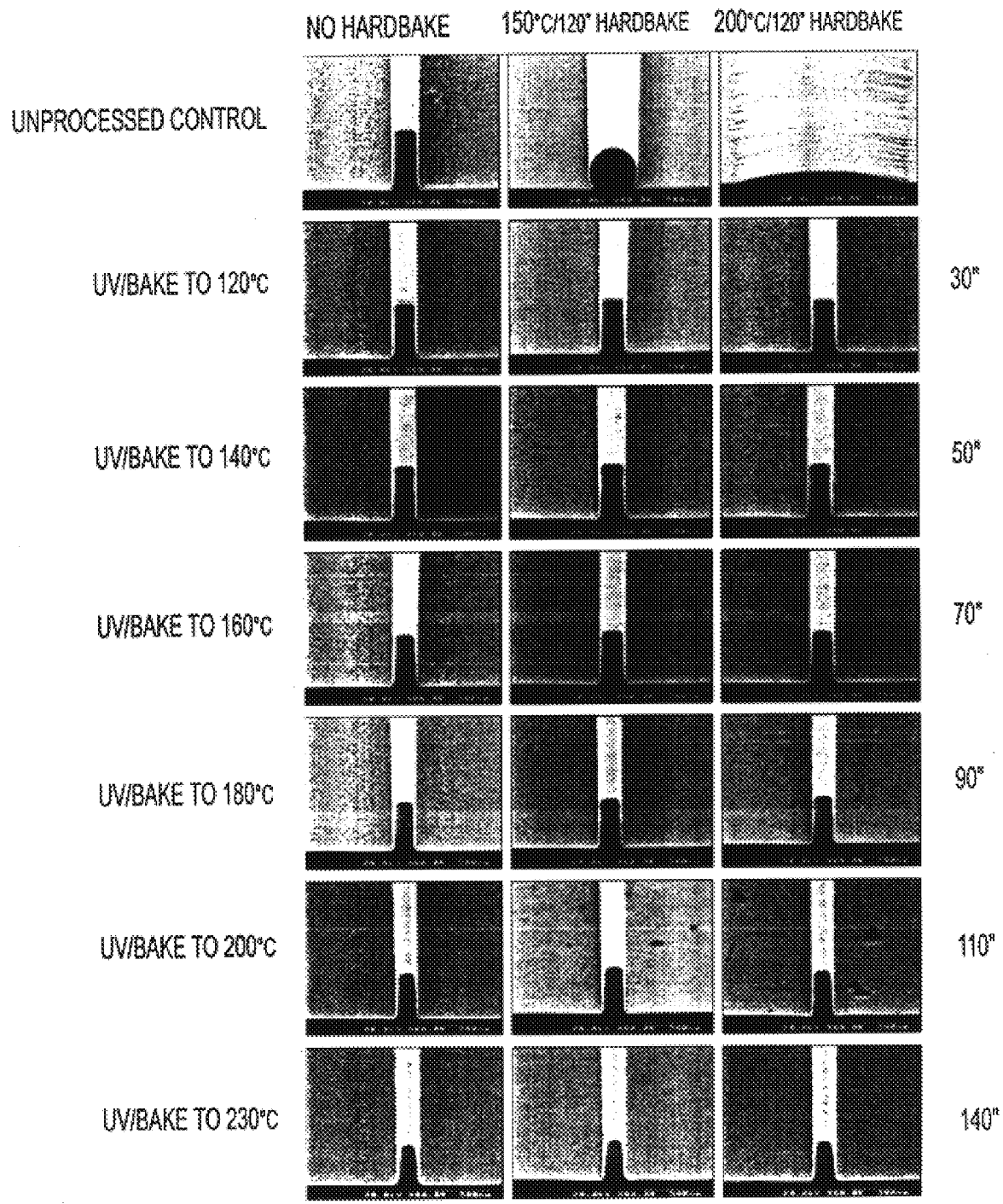
FIG. 2 includes a series of photomicrographs representing a series of features realized in a Deep UV resist and subjected to a variety of photostabilization and bake processes to show the various stages of acquired, controlled shrinkage.
Figure 3:
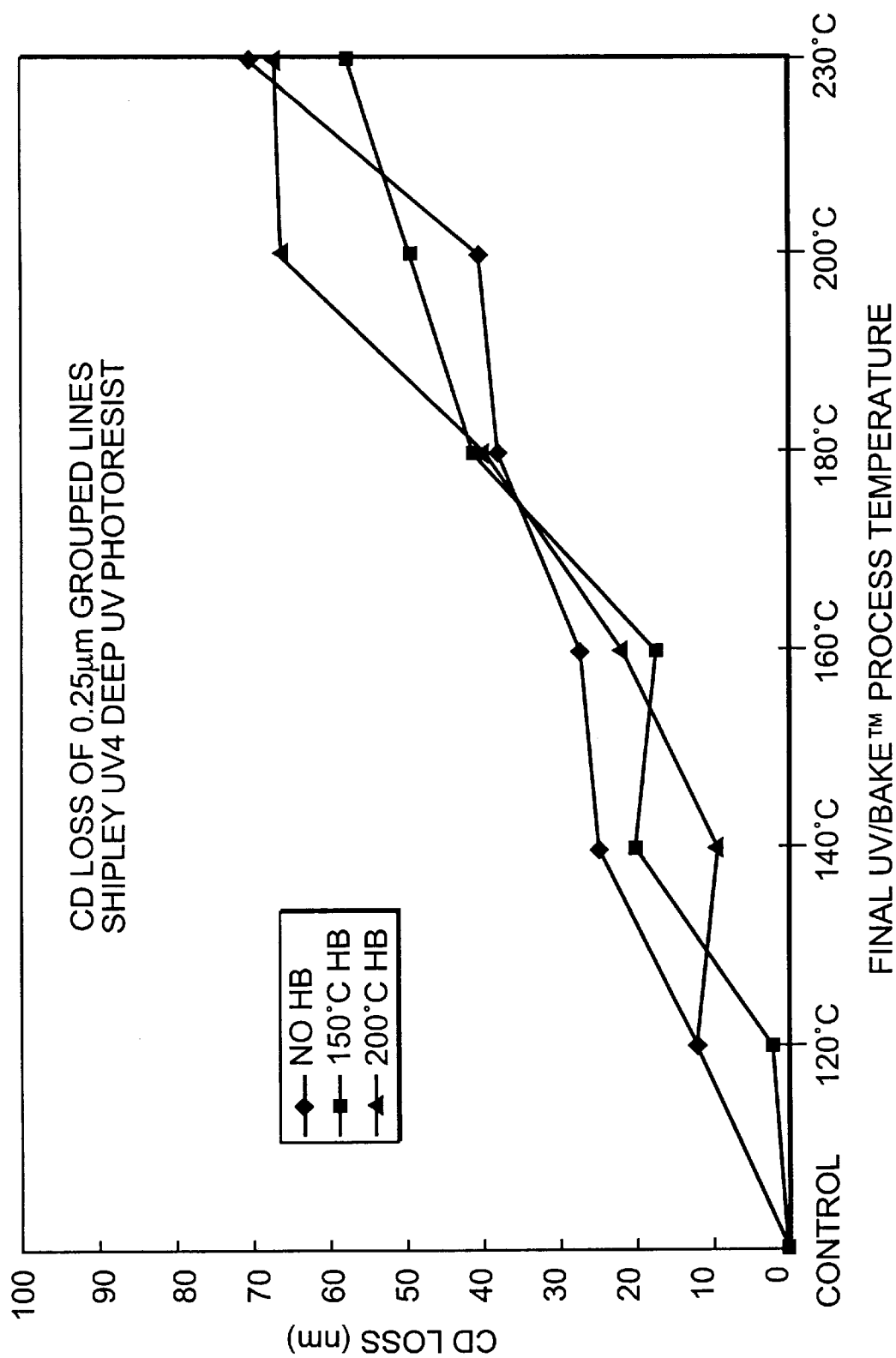
FIG. 3 represents a graphical representation of the amount of shrinkage of grouped lines of photoresist measured as critical dimension loss as a function of temperature.
Figure 4:
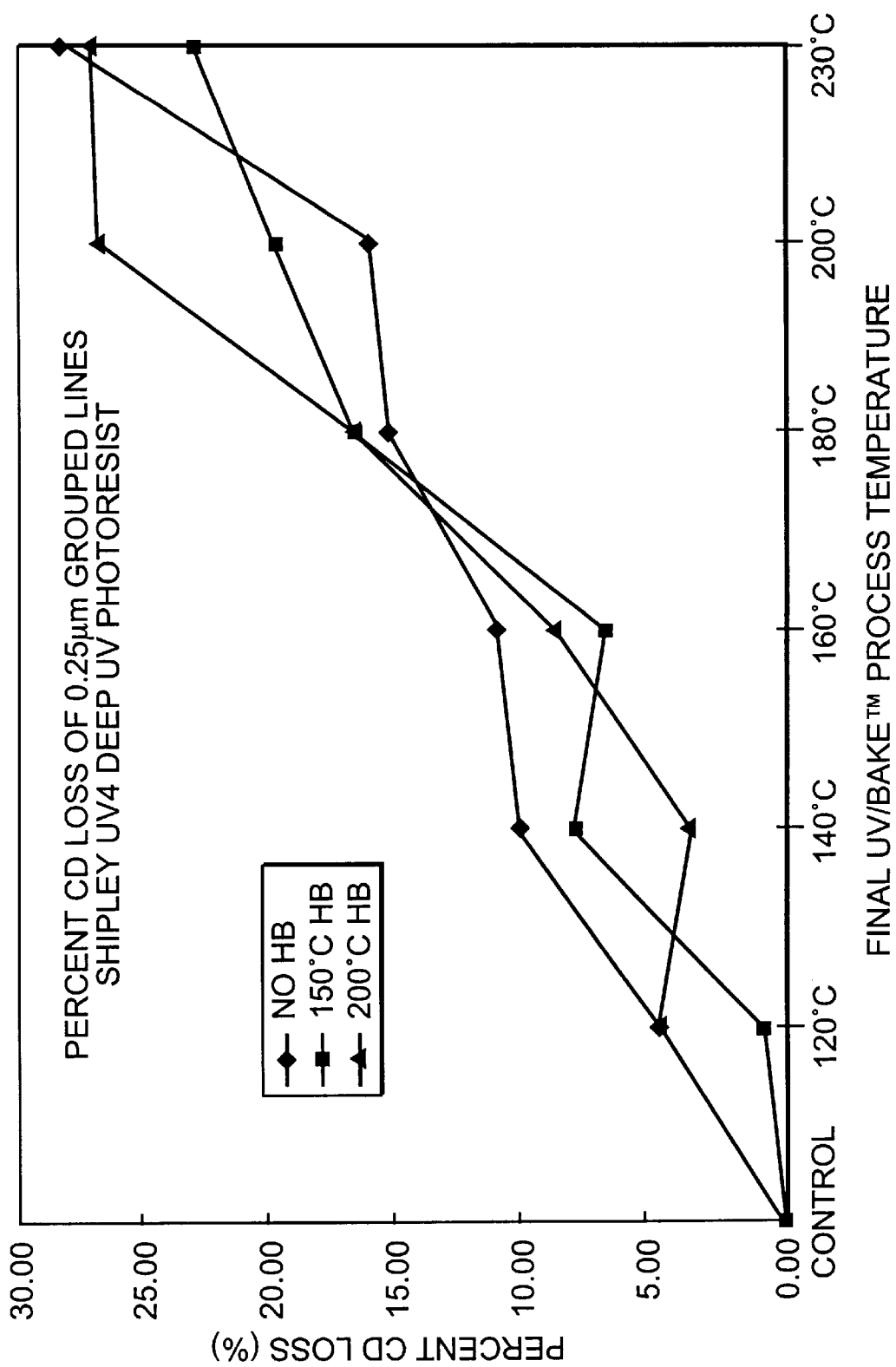
FIG. 4 represents a graphical representation of the percentage amount of shrinkage of grouped lines of photoresist measured as critical dimension loss as a function of temperature.
Figure 5:
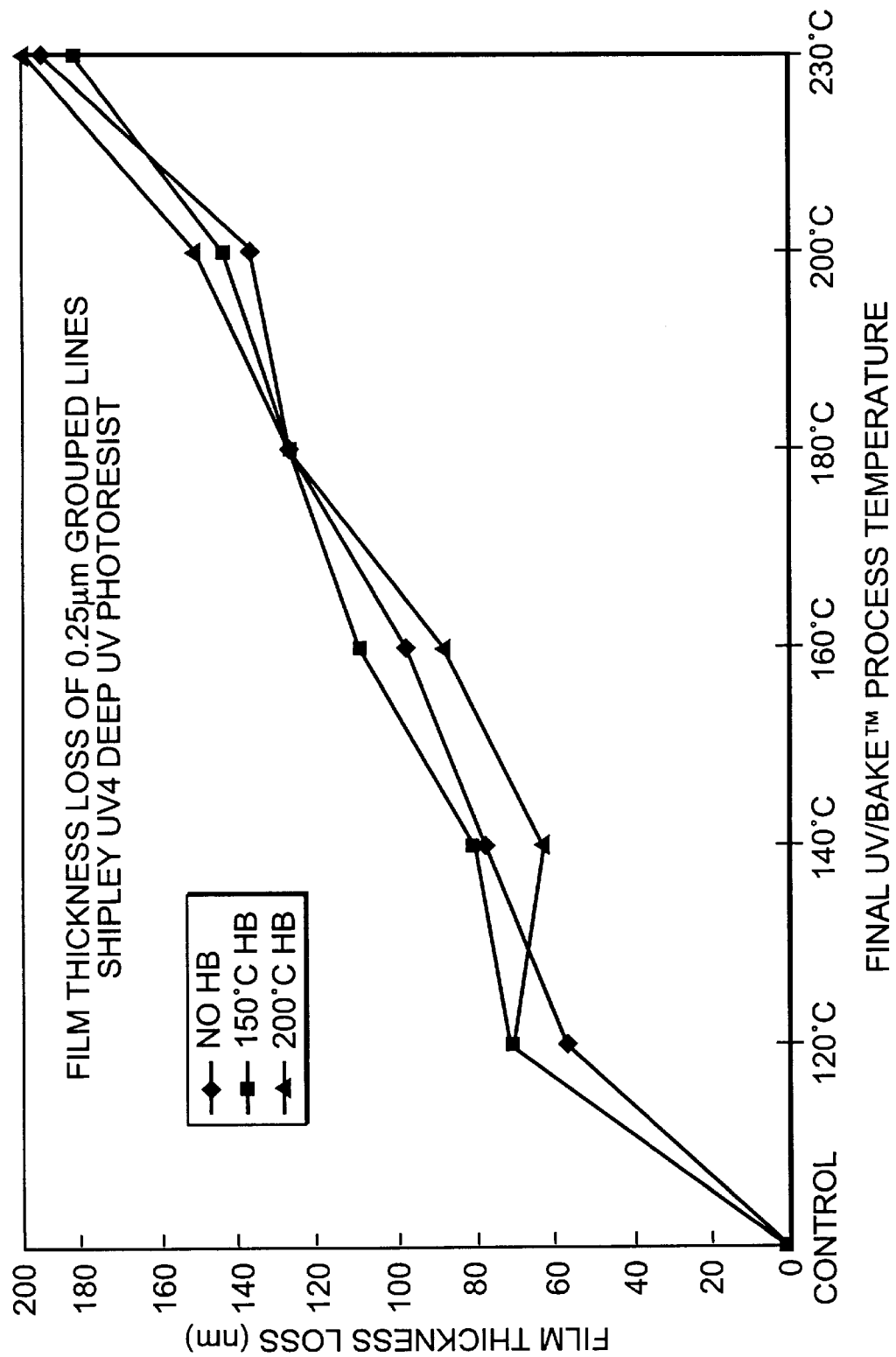
FIG. 5 represents a graphical representation of the amount of shrinkage of grouped lines of photoresist measured as film thickness loss as a function of temperature.
Figure 6:
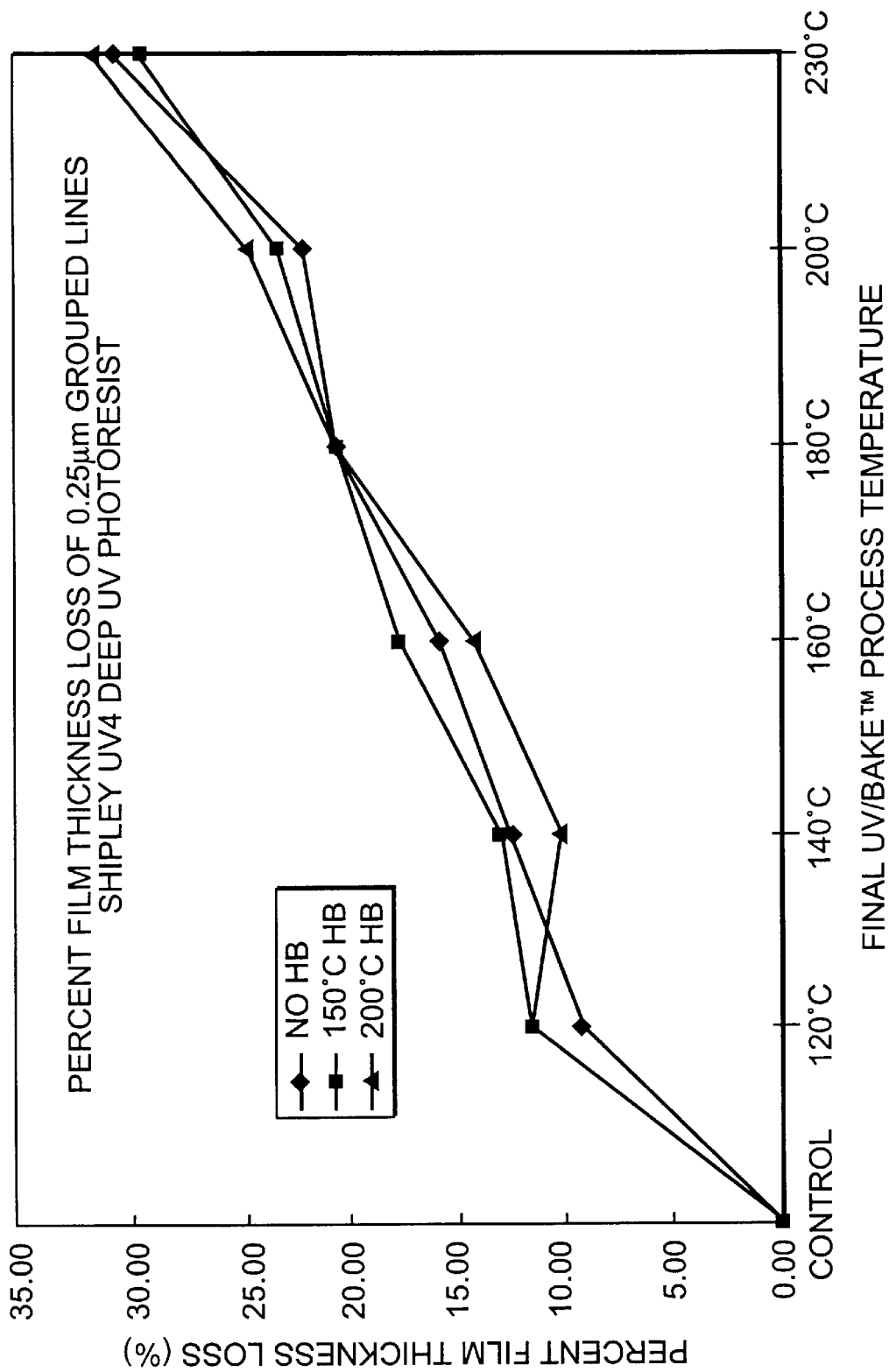
FIG. 6 represents a graphical representation of the percentage amount of shrinkage of grouped lines of photoresist measured as film thickness loss as a function of temperature.
Figure 7:
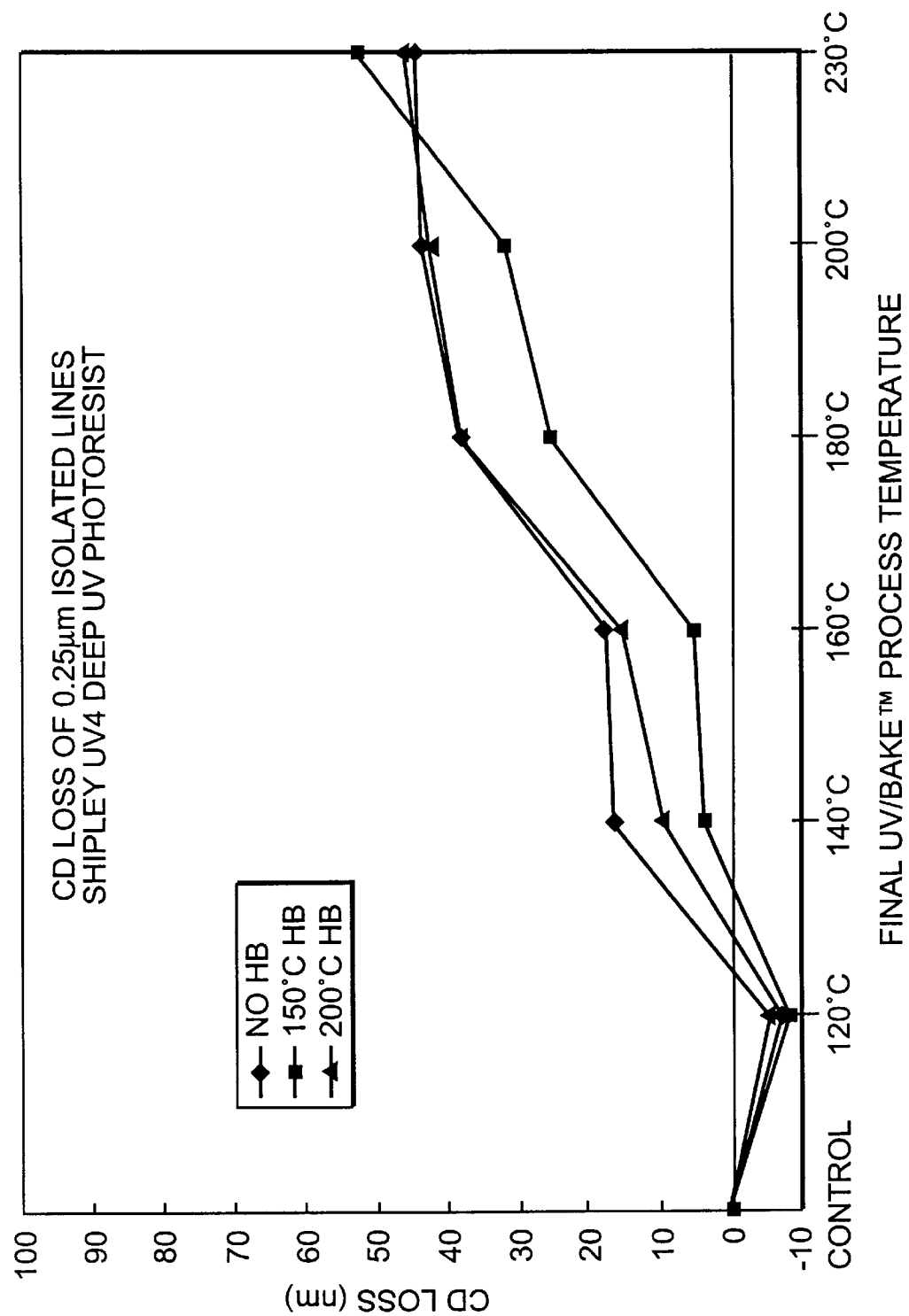
FIG. 7 represents a graphical representation of the amount of shrinkage of isolated lines of photoresist measured as critical dimension loss as a function of temperature.
Figure 8:
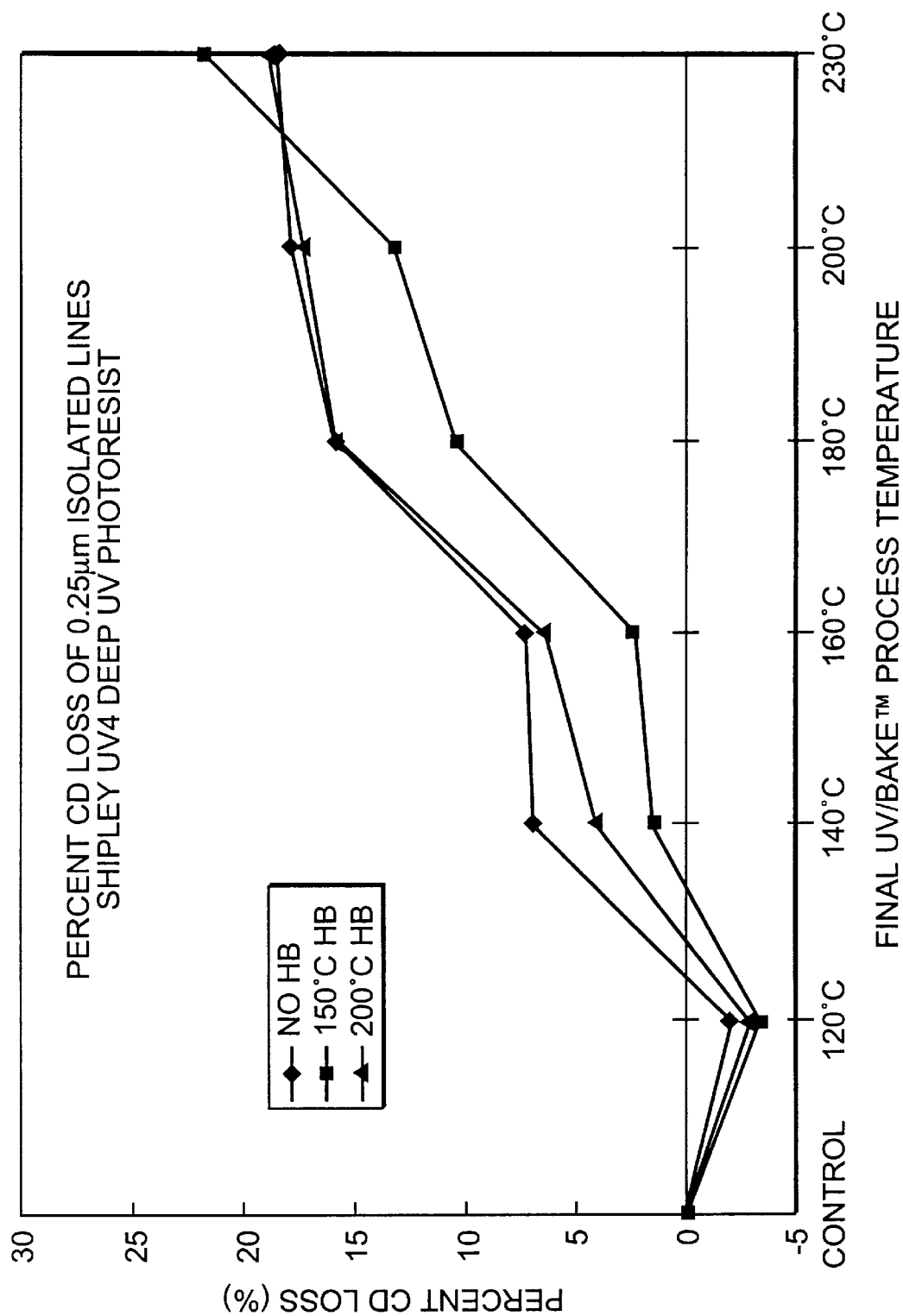
FIG. 8 represents a graphical representation of the percentage amount of shrinkage of isolated lines of photoresist measured as critical dimension loss as a function of temperature.
Figure 9:
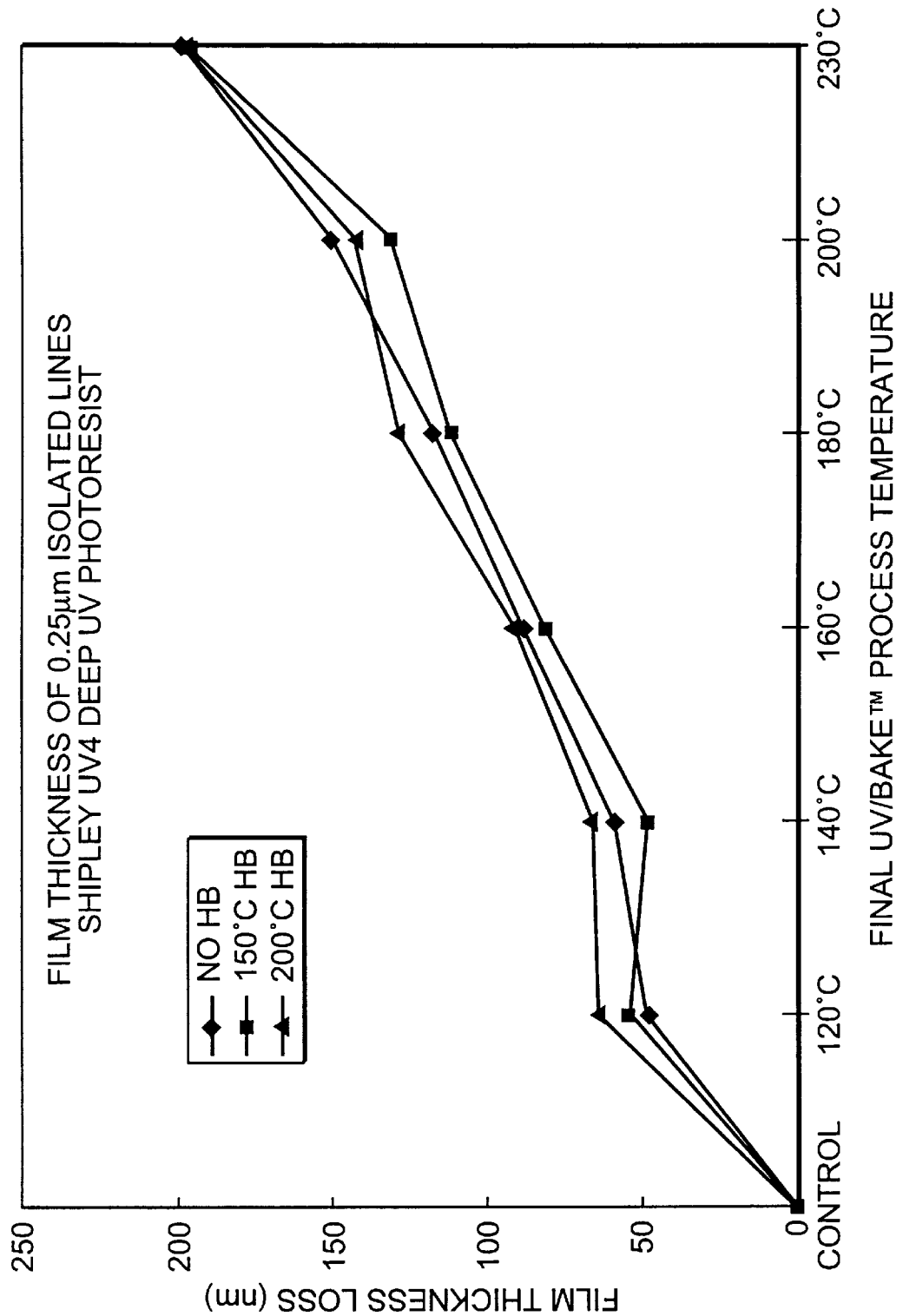
FIG. 9 represents a graphical representation of the amount of shrinkage of isolated lines of photoresist measured as film thickness loss as a function of temperature.
Figure 10:
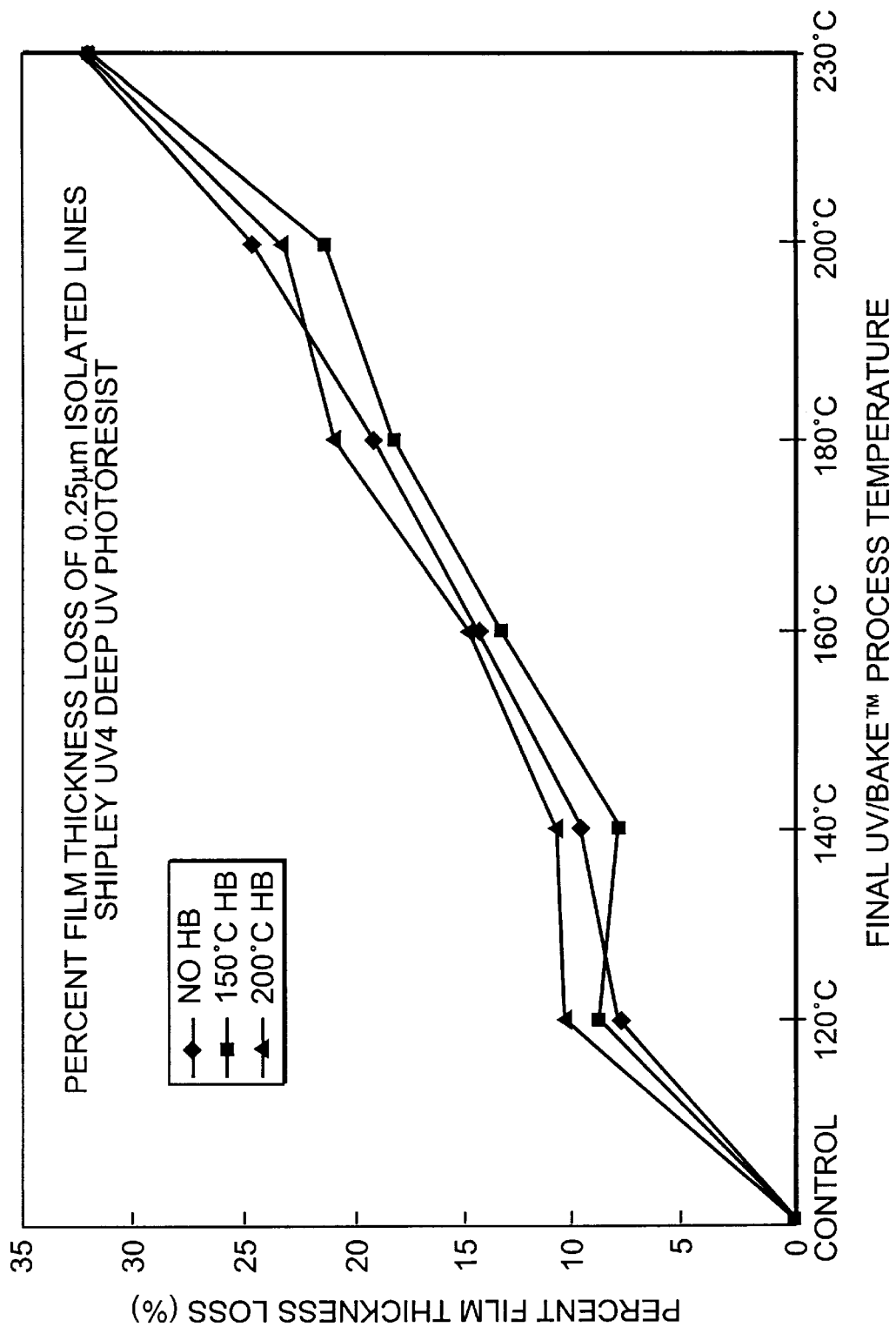
FIG. 10 represents a graphical representation of the percentage amount of shrinkage of isolated lines of photoresist measured as film thickness loss as a function of temperature.

FIG. 2 includes a series of photomicrographs showing the various stages of acquired, controlled shrinkage of isolated lines of photoresist having a width of about 0.25 $\mu$m after exposure to a variety of photostabilization and bake processes, the parameters of which are noted at the heads of the columns and rows. The columns and rows of FIG. 2 represent similar processes as shown in the columns and rows of FIG. 1.

FIGS. 3–10 includes graphical representations of the effects of various photostabilization and bake processes at various temperatures showing both absolute and relative amounts of shrinkage. In FIGS. 3–10, CD represents critical dimension and HB represents hardbake.

The present invention is particularly useful for treating deep UV photoresists. In particular, the present invention is particularly useful for treating chemically amplified photoresists. Examples of photoresists that the present invention may be utilized with are found in Ito, *Deep-UV resists: Evolution and status*, Solid State Technology, July 1996, pp. 164–173; Conley et al., *Performance of an advanced DUV photoresist for 256Mb DRAM fabrication*, Future Fab International, pp. 123–130; and Nalamasu et al., Recent progress in resist materials for 193 nm lithography; Future Fab International, pp. 159–163, the entire disclosures of all of which are hereby incorporated by reference. The examples shown in the Figures were carried out utilizing Shipley UV4 Deep UV resist (PHS/ESCAP) available from Shipley, Incorporated. Of course, any photoresist related to Shipley UV4 Deep UV resist (PHS/ESCAP) may also be used.

The present disclosure shows and describes only preferred embodiments of the present invention aforementioned, those reading the disclosure should understand the invention can be used in other combinations and environments and may be changed and modified within the scope of inventive concept expressed herein.

We claim:

1. A process for controlled shrinkage of previously defined lithographic features in a photoresist during photostabilization, said process comprising the steps of:

determining a shrinkage profile for the exposed photoresist; and exposing said photoresist features to ultraviolet radiation and elevated temperature of about 120° C. to about 230° C. until the photolithographic features shrink a desired amount, the shape of said features being preserved during said exposure.

2. The process according to claim 1, wherein said photoresist is chemically amplified.

3. The process according to claim 2, wherein said photoresist is coated on a semiconductor wafer and said photostabilization includes subjecting the wafer, coated with the chemically amplified resist, to UV radiation and simultaneously to a controlled ramped heating process to allow for a controlled shrinkage of the defined features.

4. The process according to claim 1, wherein said ultraviolet radiation has a wavelength of about 250 nm to about 350 nm.

5. The process according to claim 1, wherein said elevated temperature is from about 160° C. to about 230° C.

6. The process according to claim 1, wherein said elevated temperature is at least about 160° C.

7. The process according to claim 1, wherein prior to said exposure to ultraviolet radiation said photolithographic features have a minimum width of about 0.25 $\mu$m and after said exposure to ultraviolet radiation said photolithographic features have a minimum width of about 0.18 $\mu$m.

8. The process according to claim 1, wherein after said exposure to ultraviolet radiation said photolithographic features have a minimum width from about 5% to about 30% less than the minimum width of said photolithographic features prior to said exposure to ultraviolet radiation.

9. The process according to claim 1, wherein said photoresist is exposed to said ultraviolet radiation and said elevated temperature for a time of from about 20 seconds to about 220 seconds.

10. The process according to claim 1, wherein said photoresist is exposed to said ultraviolet radiation and said elevated temperature for a time of from about 30 seconds to about 140 seconds.

11. The process according to claim 1, wherein said photoresist is exposed to said ultraviolet radiation and said elevated temperature for a time of from about 70 seconds to about 140 seconds.

12. The process according to claim 1, wherein said ultraviolet radiation is deep ultraviolet radiation administered during the photostabilization process.

13. A method for forming a semiconductor chip device, said method comprising the steps of:

carrying out a feature-forming exposure of photoresist on a surface of a semiconductor wafer;

subjecting said semiconductor wafer and said photoresist to a post exposure bake process;

subjecting said semiconductor wafer and said photoresist to a developing process, leaving features formed of said photoresist on said semiconductor wafer;

subjecting said semiconductor wafer and said photoresist to a photostabilization process, said photostabilization process resulting in shrinkage of said photolithographic features while preserving the shape of said features; and processing said semiconductor wafer and said photoresist to form circuit features at least on the semiconductor wafer.

14. The method according to claim 13, wherein photostabilization process includes subjecting said photoresist to ultraviolet radiation and elevated temperature.

15. The method according to claim 14, wherein said ultraviolet radiation has a wavelength of about 250 nm to about 350 nm.

16. The method according to claim 14, wherein said elevated temperature is from about 120° C. to about 230° C.

17. The process according to claim 14, wherein said elevated temperature is from about 160° C. to about 230° C.

18. The method according to claim 14, wherein prior to said exposure to ultraviolet radiation said photolithographic features have a minimum width of about 0.25 $\mu$m and after said exposure to ultraviolet radiation said photolithographic features have a minimum width of about 0.19 $\mu$m.

19. The method according to claim 14, wherein after said exposure to ultraviolet radiation said photolithographic features have a minimum width from about 5% to about 30% less than the minimum width of said photolithographic features prior to said exposure to ultraviolet radiation.

20. The method according to claim 14, wherein said photoresist is chemically amplified, said photostabilization includes subjecting the wafer, coated with the chemically amplified resist, to UV radiation and simultaneously to a heating process including controlled ramped increased temperature, a constant set point increased temperature, or an increased temperature including a combination of at least one ramp and at least one plateau, thereby resulting in a controlled shrinkage of the defined features.

21. The process according to claim 14, wherein said photoresist is exposed to said ultraviolet radiation and said elevated temperature for a time of from about 20 seconds to about 220 seconds.

22. The process according to claim 14, wherein said photoresist is exposed to said ultraviolet radiation and said elevated temperature for a time of from about 30 seconds to about 140 seconds.

23. The process according to claim 14, wherein said photoresist is exposed to said ultraviolet radiation and said elevated temperature for a time of from about 70 seconds to about 140 seconds.

* * * * *